(12) United States Patent
Hinterscher

(10) Patent No.: US 6,549,049 B1
(45) Date of Patent: Apr. 15, 2003

(54) DYNAMIC VOLTAGE REFERENCE CIRCUIT

(75) Inventor: Eugene Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/120,335

(22) Filed: Apr. 11, 2002

(51) Int. Cl.[7] ................................................ H03K 3/12
(52) U.S. Cl. ............................ 327/206; 327/67; 327/72; 327/73
(58) Field of Search .............................. 327/52, 54, 65, 327/67, 68, 70, 72, 73, 108, 112, 205, 206; 330/259–260; 326/82, 83

(56) References Cited

U.S. PATENT DOCUMENTS

| | | | |
|---|---|---|---|
| 5,278,467 A | * | 1/1994 | Nedwek ........................ 327/52 |
| 5,319,265 A | * | 6/1994 | Lim .............................. 327/73 |
| 5,767,699 A | | 6/1998 | Bosynyak et al. ............. 326/86 |
| 5,892,717 A | | 4/1999 | Malarsie ................. 365/189.06 |
| 5,973,526 A | | 10/1999 | Dabral ........................ 327/170 |
| 5,999,020 A | | 12/1999 | Volk et al. ..................... 599/20 |
| 6,034,551 A | | 3/2000 | Bridgewater, Jr. ............ 326/82 |
| 6,058,144 A | | 5/2000 | Brown ........................ 375/316 |
| 6,118,318 A | * | 9/2000 | Finfield et al. .............. 327/206 |
| 6,169,424 B1 | * | 1/2001 | Kurd ............................ 327/53 |
| 6,275,094 B1 | | 8/2001 | Cranford, Jr. et al. ....... 327/534 |
| 6,288,581 B1 | | 9/2001 | Wong .......................... 327/108 |
| 6,307,401 B1 | | 10/2001 | Bridgewater, Jr. ............ 326/86 |
| 6,332,004 B1 | | 12/2001 | Chan .......................... 327/257 |

OTHER PUBLICATIONS

Mel Bazes, "Two Novel Fully Complementry Self–Biased CMOS Differential Ampliers", IEEE Journal of Solid–State Circuits, Feb. 1991, vol. 26, No. 2, pp. 165–168.
Chi–Chang Wang et al, "A 3.3–V/5–V —Low Power TTL–to–CMOS Input Buffer", IEEE Journal of Soild–State Circuits, April 1998, vol. 33, No. 4, pp. 598–603.

* cited by examiner

Primary Examiner—Terry D. Cunningham
Assistant Examiner—Long Nguyen
(74) Attorney, Agent, or Firm—April M. Mosby; Wade James Brady, III; Frederick J. Telecky, Jr.

(57) ABSTRACT

A differential pair input receiver (30) having variable reference voltages that may be customized by the designer so as to increase and decrease noise margins of the amplifier. This input receiver (30) includes a complementary self-biased differential amplifier (10) and a dynamic hysteresis voltage reference circuit (20), wherein the complementary self-biased differential amplifier (10) has an input node (Input$_2$), a reference output node (S$_2$), and a dynamic voltage reference node (V$_{DYNREF}$). The dynamic hysteresis voltage reference circuit (20) connects between the reference output node (S$_2$) and the dynamic voltage reference node (V$_{DYNREF}$) to provide a reference voltage (V$_{ref}$) at the dynamic voltage reference node(V$_{DYNREF}$). The reference voltage (V$_{ref}$) serves as a threshold for the complementary self-biased differential amplifier (10), such that the output transitions from high-to-low and low-to-high when the input is equal to the reference voltage (V$_{ref}$). Furthermore, the dynamic hysteresis voltage reference circuit (20) adjusts the reference voltage (V$_{ref}$) to provide a different threshold for each respective transition from high-to-low and from low-to-high.

5 Claims, 4 Drawing Sheets

DYNAMIC VOLTAGE REFERENCE CIRCUIT

FIELD OF THE INVENTION

The present invention relates to differential amplifiers and, more particularly, to a complementary self-biased differential amplifiers having DC hysteresis.

BACKGROUND OF THE INVENTION

Complementary self-biased differential amplifiers (CSDA) are CMOS differential amplifiers having an input common-mode range that is relatively limited. The CDSA is characterized by its self-biasing through negative feed-back. In addition, CDSAs are completely complementary where each n-type device operates in push-pull fashion with a corresponding p-type device.

As shown in FIG. 1, a CSDA includes two complementary differential amplifiers connected together having the input drains connected to one another. As shown transistors $M_{N1}$, $M_{N2}$, and $M_{N3}$ comprise a first amplifier and $M_{P1}$, $M_{P2}$, $M_{P3}$, and $M_{P4}$ comprise a second amplifier coupled together. In order to bias the circuit in a stabilized fashion, the current through transistors $M_{N2}$, $M_{P2}$, and $M_{P3}$ is made the same by coupling the gates of transistors $M_{N2}$, $M_{P2}$, and $M_{P3}$ to the internal voltage node Vbias. This self-biasing of the amplifier creates a negative-feedback loop that stabilizes the bias voltages in the case of any variations in processing parameters or operating conditions.

As a result of their distinctive design, CDSAs include several performance enhancements over conventional CMOS differential amplifier designs. CDSAs include active-region biasing that is less sensitive to variations in processing, temperature and supply. Furthermore, CDSAs have the capability of supplying switching currents that are significantly greater than the quiescent bias current. CDSAs also include nominal doubling of differential-mode gain.

All of these features make the CDSA a prime candidate for comparator applications where precision, high speed, ease of interfacing to ordinary logic gates, and consistently high production yields are required. One such application is in commercial digital CMOS VLSI integrated circuits.

Complications, however, arise in applications where the CDSA is used in a backplane as a differential pair input receiver when excessive noise levels exist on the backplane. In cases where the backplane is properly terminated to match the effective characteristic impedance of the bus as shown in FIG. 2, there may be a small amount of overshoot and undershoot in the signal. Thus, the upper and lower noise margins, A and B, are large leaving room for noise that may be present on the backplane. As shown in the present example, the voltage reference is 1 volt which is the voltage necessary to be applied at the input of the amplifier to switch the output from low to high or from high to low depending upon the present state of the amplifier output.

Problems arise, however, in the case where the backplane is overly terminated. As shown, an overshoot and undershoot occurs near the transition during a low-to-high and a high-to-low transition. The undershoots and overshoots generate smaller upper and lower noise margins, respectively, for input receivers where the backplane is over or under terminated as opposed to the backplane that is properly terminated. Specifically, regions A and B represent the upper and lower noise margin for the properly terminated backplane; and regions C and D represent the upper and lower noise margins for the overly terminated backplane. Regions A and B are comparatively larger than regions C and D due to the reasons described above. Thereby, a smaller margin for noise exists when the backplane is overly terminated. The same holds true when the backplane is unevenly loaded.

Thus, there exists a need for a CDSA having the ability to maintain an adequate noise margin in applications where the CDSA is used for an input receiver of a backplane whether the backplane is properly terminated, overly terminated or unevenly loaded.

SUMMARY OF THE INVENTION

To address the above-discussed deficiencies of the complementary self-biased differential amplifier, the present invention teaches a differential pair input receiver including a complementary self-biased differential amplifier, wherein the complementary self-biased differential amplifier has an input, a reference output node, and a dynamic voltage reference node. A dynamic hysteresis voltage reference circuit connects between the reference output node and the dynamic voltage reference node to provide a reference voltage at the dynamic voltage reference node. The reference voltage serves as a threshold for the complementary self-biased differential amplifier, such that the output transitions from high-to-low and low-to-high when the input is equal to the reference voltage. Furthermore, the dynamic hysteresis voltage reference circuit adjusts the reference voltage to provide a different threshold for each respective transition from high-to-low and from low-to-high, increasing the noise margins for each.

Advantages of this design include but are not limited to a differential pair input receiver having variable reference voltages that may be customized by the designer. As a result, this design for the differential pair input receiver may increase the noise margins. Thus, providing a more stable circuit design.

BRIEF DESCRIPTION OF THE DRAWINGS

For a more complete understanding of the present invention and the advantages thereof, reference is now made to the following description taken in conjunction with the accompanying drawing in which like reference numbers indicate like features and wherein.

DETAILED DESCRIPTION OF PREFERRED EMBODIMENTS

Figure 1:
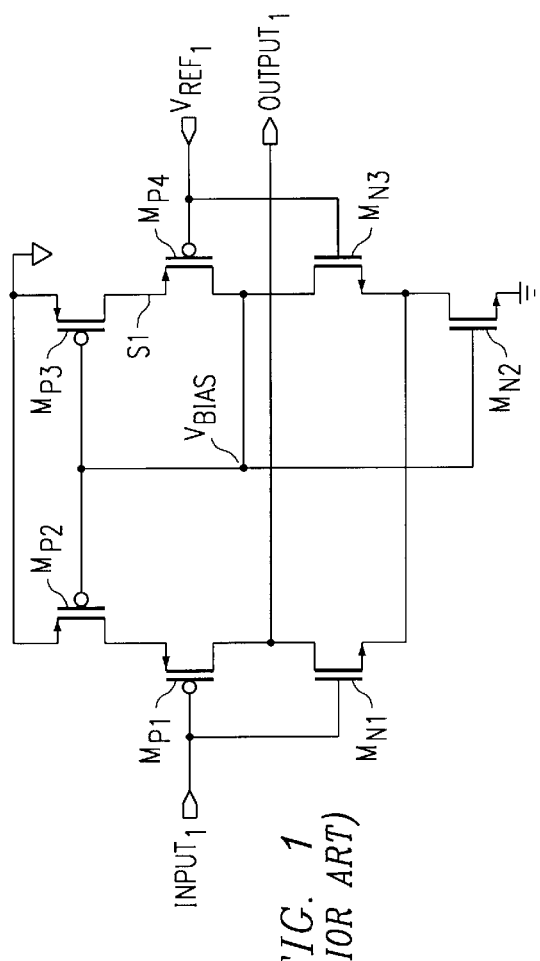
FIG. 1 illustrates a known complementary self-biased differential amplifier.
Figure 2:
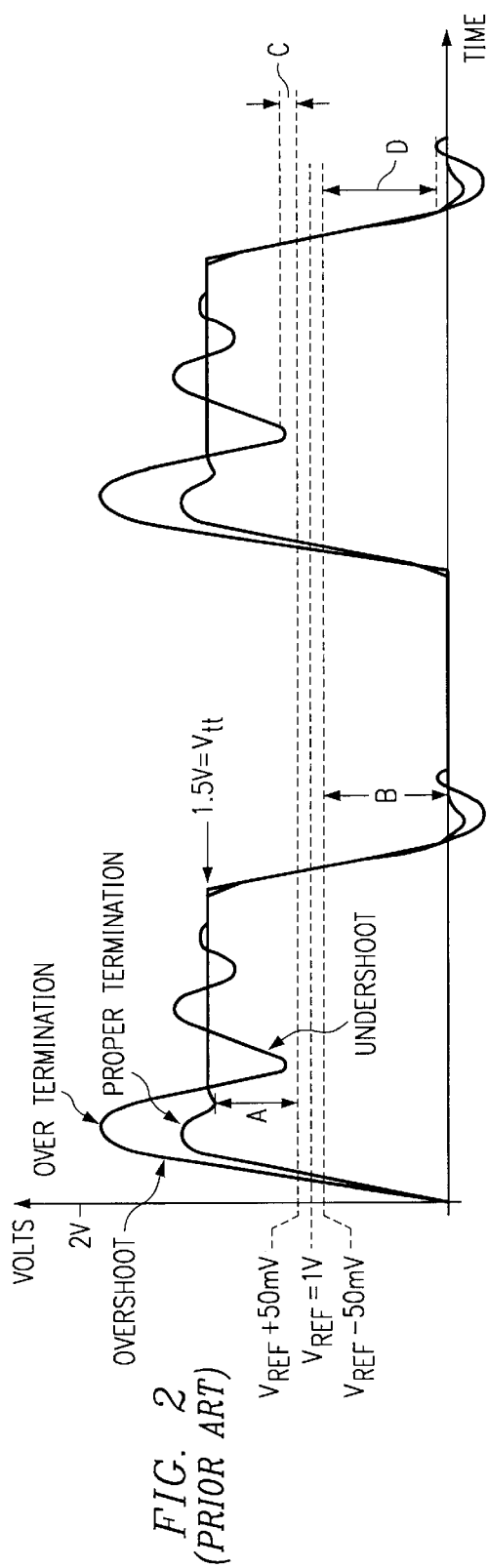
FIG. 2 displays the input waveforms of the amplifier in FIG. 1.
Figure 3:
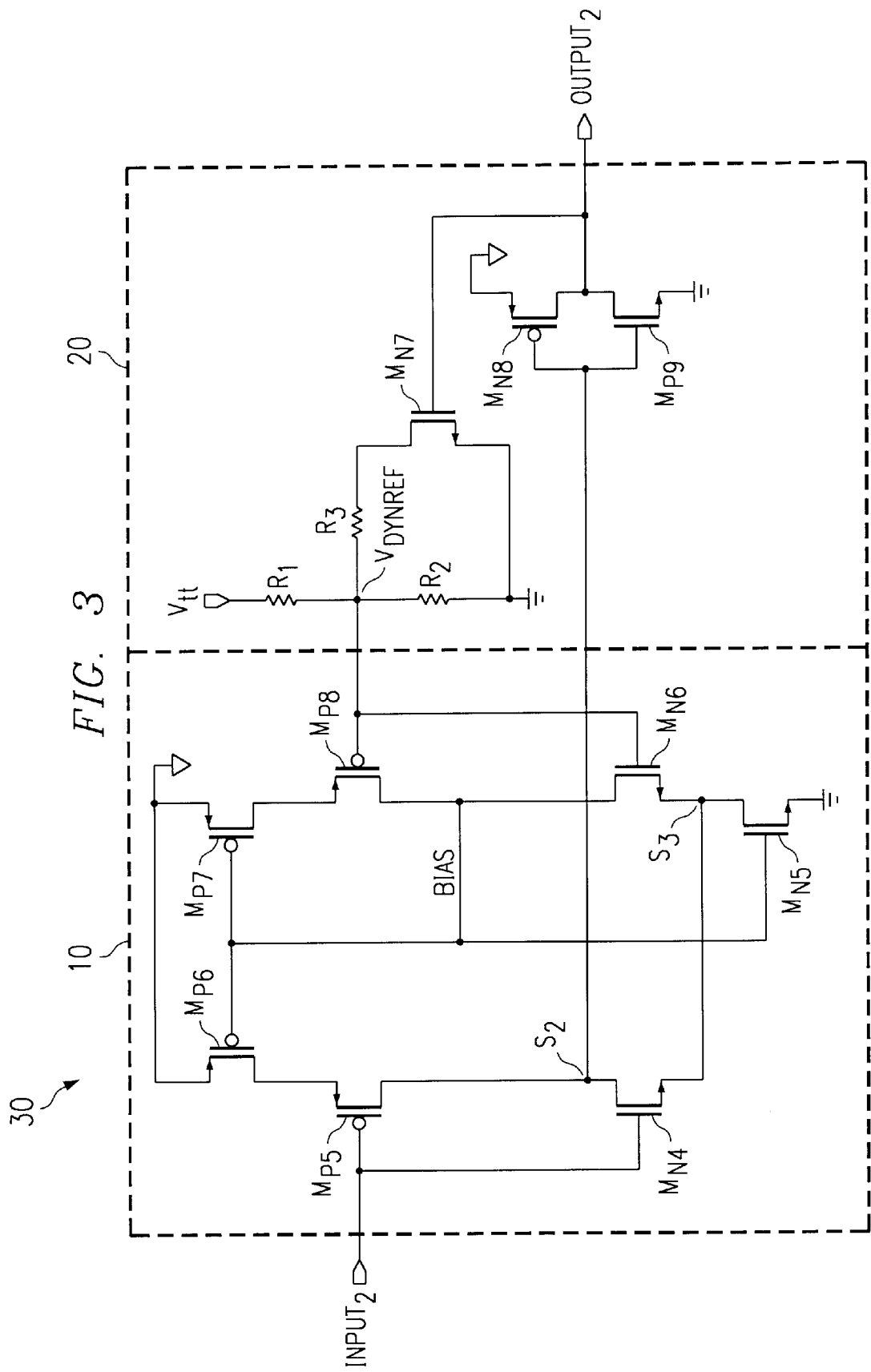
FIG. 3 shows the schematic of the complementary self-biased differential amplifier of the present invention.

As shown in FIG. 3, differential pair input receiver 30 of the present invention includes a complementary self-biased differential amplifier 10 coupled to a dynamic hysteresis voltage reference circuit 20. The complementary self-biased differential amplifier 10 includes an input node $Input_2$, a reference output node $S_2$, and a dynamic voltage reference node $V_{DYNREF}$. The dynamic hysteresis voltage reference circuit 20 connects between the reference output node $S_2$ and the dynamic voltage reference node $V_{DYNREF}$ to provide a reference voltage $V_{ref}$ at the dynamic voltage reference node $V_{DYNREF}$. The reference voltage $V_{ref}$ serves as a threshold for the complementary self-biased differential amplifier 10, such that the output node $Output_2$ transitions from high-to-low and low-to-high when the input node $Input_2$ is equal to the reference voltage $V_{ref}$. Furthermore, the dynamic hysteresis voltage reference circuit 20 adjusts the reference voltage $V_{ref}$ to provide a different threshold for each respective transition from high-to-low and from low-to-high.

Specifically, differential pair input receiver 30 includes CSDA 10 a first amplifier comprising transistors $M_{N4}$, $M_{N5}$, and $M_{N6}$ and a second amplifier coupled to the first amplifier. The second amplifier comprising transistors $M_{P5}$, $M_{P6}$, $M_{P7}$, and $M_{P8}$. In order to bias circuit 10 in a stabilized fashion, the current through transistors $M_{N5}$, $M_{P6}$, and $M_{P7}$ is made the same by coupling the gates of transistors $M_{N5}$, $M_{P6}$, and $M_{P7}$ to the internal voltage node $V_{bias}$. This self-biasing of the amplifier creates a negative-feedback loop that stabilizes the bias voltages in cases where variations in processing parameters or operating conditions exist.

To increase noise margins for the differential pair input receiver 30, dynamic hysteresis voltage reference circuit 20 includes transistors $M_{N8}$ and $M_{P9}$ coupled between the reference output node $S_2$ and output node $Output_2$ as pull-up and pulldown transistors. The gate of transistor $M_{N7}$ connects to the output node $Output_2$. A voltage divider made of resistors $R_1$, $R_2$, $R_3$ and transistor $M_{N7}$ work in such a fashion that when the input node is ramping from low-to-high, transistor $M_{N7}$ switches on enabling the leg of the divider that includes $R_3$. The voltage $V_{ref}$ at the dynamic voltage reference node $V_{DYNREF}$ is determined by the values of all three resistors, $R_1$, $R_2$, and $R_3$. This voltage represents the input threshold of the differential amplifier for a high-to-low transition and is the upper noise margin threshold. During a high-to-low transition, transistor $M_{N7}$ switches off, disabling the leg of the divider that includes resistor $R_3$. The voltage $V_{ref}$ at the dynamic voltage reference node $V_{DYNREF}$ is determined solely by resistors, $R_1$ and $R_2$. During a high-to-low transition, transistor $M_{N7}$ remains on until the voltage falls below the upper noise margin threshold. One embodiment may include a lower noise margin threshold of 1.2 V and an upper noise margin threshold of 0.8V.

In operation, while the input node $Input_2$ ramps from ground or 0V to the power supply rail $V_{CC}$, transistor $M_{P5}$ remains on until the input reaches the threshold voltage and then it turns off. Transistors $M_{P6}$ and $M_{P7}$ remain on until the input node $Input_2$ reaches the threshold voltage. Transistor $M_{N4}$ is off until the input node $Input_2$ reaches the threshold and then it turns on. Transistors $M_{N5}$, $M_{N6}$, and $M_{P8}$ remain on for the duration. Transistor $M_{N8}$ is on until the input node $Input_2$ reaches the threshold and then it turns off. Transistor $M_{P9}$ is off until the input node $Input_2$ reaches the threshold and then it turns on. Transistor $M_{N7}$ is off until the input node $Input_2$ reaches the threshold and then it turns on. Output node $Output_2$ remains 0V until the input reaches the threshold and then it switches to the voltage of the power supply rail $V_{CC}$.

In operation, while the input node $Input_2$ ramps from the power supply rail voltage $V_{CC}$ to ground or 0V, transistor $M_{P5}$ remains off until the input reaches the threshold voltage and then it turns on. Transistors $M_{P6}$ and $M_{P7}$ remain on until the input node $Input_2$ reaches the threshold voltage. Transistor remains on. Transistor $M_{N4}$ is on until the input node $Input_2$ reaches the threshold and then it turns off. Transistors $M_{N5}$, $M_{N6}$, and $M_{P8}$ remain on for the duration. Transistor $M_{N8}$ is off until the input node $Input_2$ reaches the threshold and then it turns on. Transistor $M_{P9}$ is on until the input node $Input_2$ reaches the threshold and then it turns off. Transistor $M_{N7}$ is on until the input node $Input_2$ reaches the threshold and then it turns off. Output node $Output_2$ remains at the power supply rail $V_{CC}$ until the input reaches the threshold and then it switches to ground or 0V.

Figure 4:
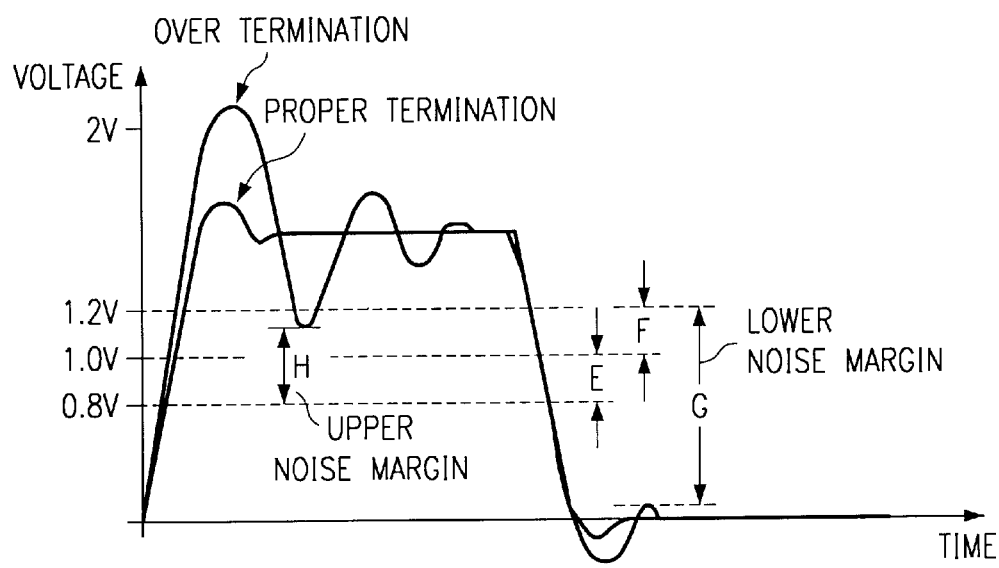
FIG. 4 displays the input waveforms of the amplifier in FIG. 3.

FIG. 4 displays input waveforms of the differential pair input receiver of FIG. 3. In cases where the backplane is properly terminated to match the effective characteristic impedance of the bus as shown, there may be a small amount of overshoot and undershoot in the signal. In the case where the input waveform has been over or under terminated, the increase F in the lower noise margin G for the high-to-low transition preserves the circuits stability where excessive noise levels exist on the back plane. The same is the case for the increase E in the upper noise margin H for the low-to-high transition. Thus, the upper and lower noise margins, H and G, are large enough for excessive noise present on the backplane. As shown in this example, the lower noise margin threshold is 1.2 V and the upper noise margin threshold is 0.8V; showing a 200 mV increase in each noise margin.

Those of skill in the art will recognize that the value of resistors R1, R2, and R3 may be varied to produce differing threshold voltages for both the high-to-low transition and the low-to-high transition.

Figure 5:
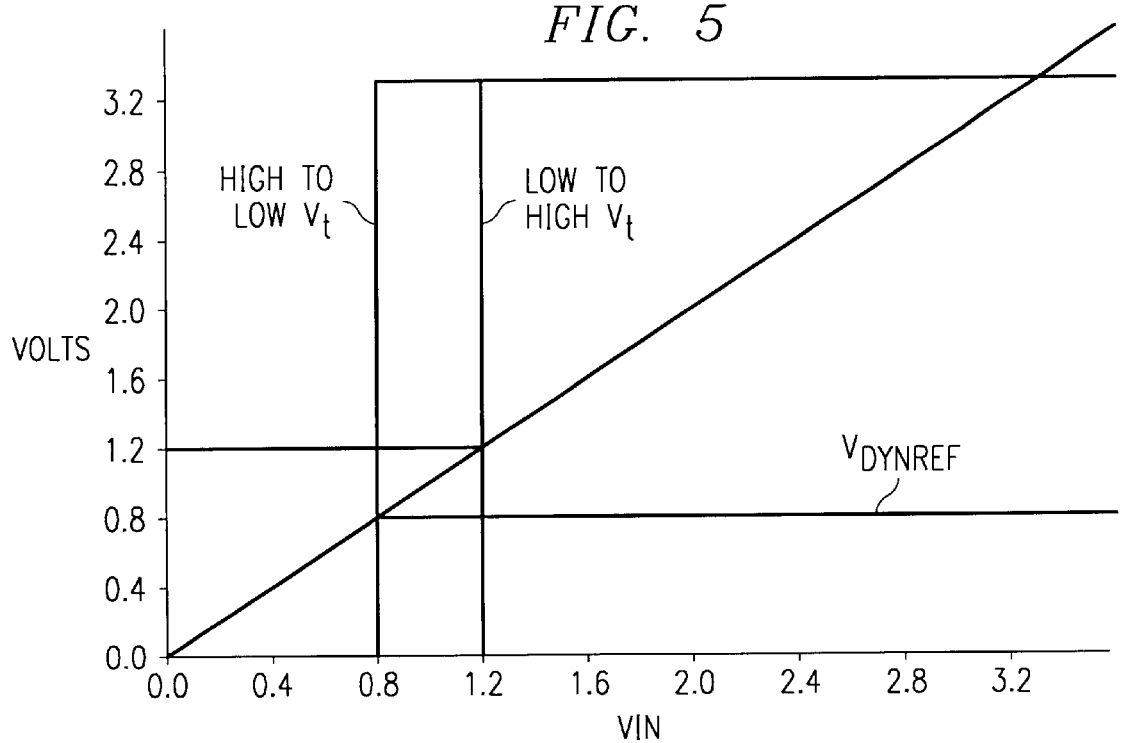
FIG. 5 illustrates voltage levels for various nodes for the amplifier of FIG. 3.

FIG. 5 illustrates voltage levels for various nodes for the amplifier of FIG. 3. As shown, input node $Input_2$ ramps up from 0V to $V_{CC}$ and ramps down from $V_{CC}$ to 0V. The output shifts on two different thresholds. In the present instance, the threshold for the high-to-low transition is 0.8V and the threshold for the low-to-high transition is 1.2V.

Figure 6:
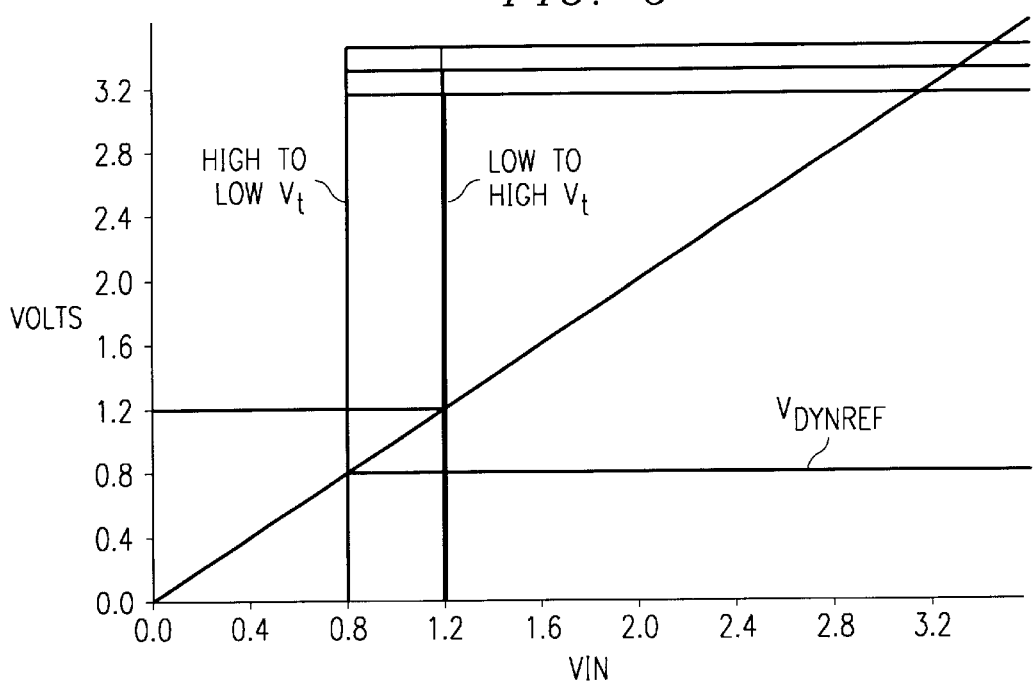
FIG. 6 shows voltage levels for various nodes for the amplifier of FIG. 3 in accordance with variations in process, temperature and power.

FIG. 6 shows voltage levels for various nodes for the amplifier of FIG. 3 in accordance with variations in process, temperature and power. Variations in any of these parameters do not highly effect the value of the either threshold to the advantage of this input receiver design.

Figure 7:
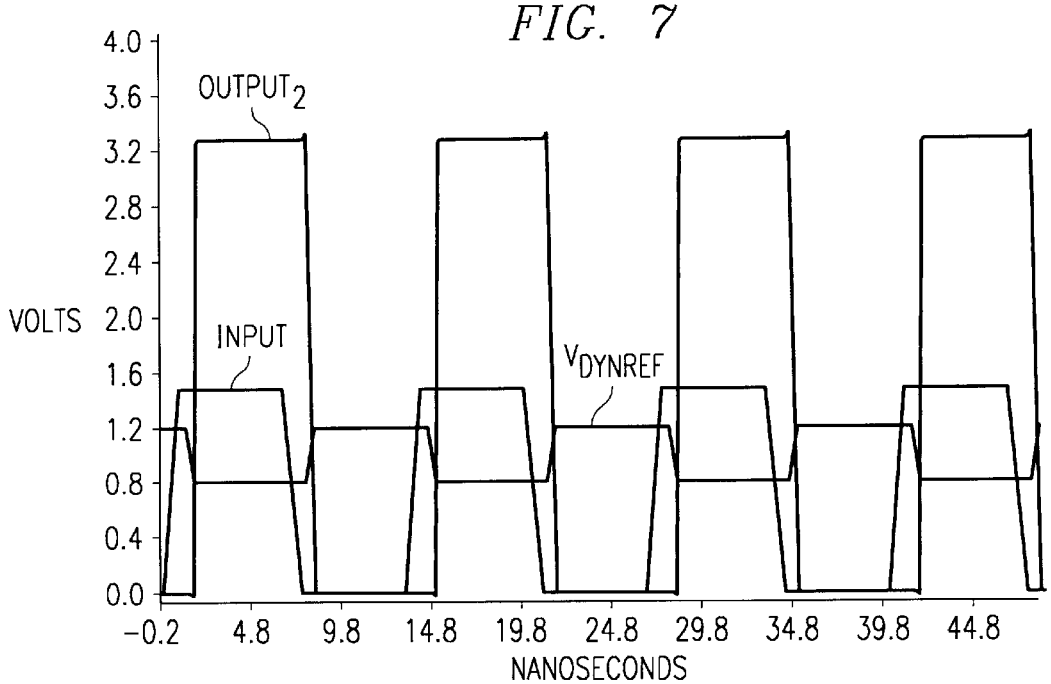
FIG. 7 illustrates the dynamic voltage levels for various nodes for the amplifier of FIG. 3.

FIG. 7 illustrates voltage levels for the input node $Input_2$ in transit or alternating current (AC) mode, the output node $Output_2$ and the dynamic voltage reference node $V_{DYNREF}$ for the amplifier of FIG. 3.

Advantages of this design include but are not limited to a differential pair input receiver having variable reference voltages that may be customized by the designer. As a result, this design for the differential pair input receiver may increase the noise margins. Thus, providing a more stable circuit design.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A differential pair input receiver comprising:
   a complementary self-biased differential amplifier, having an input, a reference output node, and a dynamic voltage reference node; and
   a dynamic hysteresis voltage reference circuit, including an output, the dynamic hysteresis voltage reference circuit coupled between the reference output node and the dynamic voltage reference node to provide a reference voltage at the dynamic voltage reference node, the reference voltage provides a threshold for the complementary self-biased differential amplifier, whereby the output transitions from high-to-low and low-to-high when the input is equal to the reference voltage, the dynamic hysteresis voltage reference circuit adjusts the reference voltage to provide a different threshold for each respective transition from high-to-low and from low-to-high.

2. A differential pair input receiver as recited in claim 1, wherein the complementary self-biased differential amplifier comprises:
   a first n-type transistor, having a gate, a drain, and a source, the gate coupled to the input;
   a first p-type transistor, having a gate, a drain, and a source, the drain coupled to the drain of the first n-type transistor to form the reference output node, the gate coupled to the input;
   a second p-type transistor, having a gate, a drain, and a source, the drain coupled to the source of the first p-type transistor, the source coupled to a power supply rail;
   a second n-type transistor, having a gate, a drain, and a source, the gate coupled to the gate of the second p-type transistor to form a voltage bias node, the source coupled to ground, drain coupled to the source of the first ntype transistor;
   a third n-type transistor, having a gate, a drain, and a source, the source coupled to the drain of the second n-type transistor, the drain coupled to the voltage bias node;
   a third p-type transistor, having a gate, a drain, and a source, the drain coupled to the voltage bias node, the gate coupled to the gate of the third n-type transistor to form the dynamic voltage reference node; and
   a fourth p-type transistor, having a gate, a drain, and a source, the source coupled to the power supply rail, the drain coupled to the source of the third p-type transistor, the gate coupled to the voltage bias node.

3. A differential pair input receiver as recited in claim 1, wherein the dynamic voltage reference circuit comprises:
   a voltage divider circuit coupled to provide a threshold voltage at the dynamic reference voltage node;
   a first p-type transistor, having a gate, a drain and a source, the drain coupled to the voltage divider circuit to form the output of the differential pair input receiver, the source coupled to the power supply rail, the gate coupled to the reference output node; and
   a first n-type transistor, having a gate, a drain, and a source, the source coupled to ground, the drain coupled to the drain of the first p-type transistor, the gate coupled to the reference output node.

4. A differential pair input receiver as recited in claim 3, wherein the voltage divider circuit comprises:
   a first resistor coupled between the power supply rail and the dynamic reference voltage node;
   a second resistor coupled between the first resistor and ground;
   a third resistor coupled to the dynamic reference voltage node; and
   a second n-type transistor, having a gate, a drain, and a source, the drain coupled to the third resistor, the source coupled to ground, the gate coupled to drain of the first p-type transistor.

5. A method which increases the noise margin of a differential pair input receiver, comprising the steps of:
   applying a voltage at the input of the differential pair input receiver including a complementary self-biased differential amplifier, having a intermediate voltage node and reference voltage node, coupled to a dynamic hysteresis voltage reference circuit, having an output, the dynamic hysteresis voltage reference circuit coupled between the intermediate voltage node and the reference voltage node,
   supplying a first reference voltage to the reference voltage node to provide a voltage threshold when the output is low using the dynamic hysteresis voltage reference circuit coupled to the reference voltage node; and
   supplying a second reference voltage to the reference voltage node to provide a voltage threshold when the output is high using the dynamic hysteresis voltage reference circuit coupled to the reference voltage node.

* * * * *